United States Patent [19]

Ostroff et al.

[11] 4,451,791

[45] May 29, 1984

[54] METHOD AND APPARATUS FOR ELECTRICALLY TESTING ELEMENTS OF MULTI-CELL BATTERIES

[75] Inventors: Stuart S. Ostroff, Abington; William G. Bevan, Birdsboro, both of Pa.

[73] Assignee: General Battery Corporation, Reading, Pa.

[21] Appl. No.: 359,014

[22] Filed: Mar. 17, 1982

[51] Int. Cl.³ .............................................. G01N 27/46
[52] U.S. Cl. ................................. 324/434; 324/73 AT; 324/437; 209/3.3
[58] Field of Search .................. 324/73 AT, 425, 426, 324/434, 435, 437; 114/91; 209/3.2, 3.3

[56] References Cited

U.S. PATENT DOCUMENTS

| | | | |
|---|---|---|---|
| 3,563,806 | 2/1971 | Hruden | 429/91 |
| 3,609,525 | 9/1971 | Clingenpeel et al. | 324/434 |
| 3,612,250 | 10/1971 | Thompson et al. | 209/3.3 |
| 3,623,603 | 11/1971 | Casner et al. | 209/3.3 |
| 3,645,391 | 2/1972 | Hirakawa et al. | 209/3.3 |
| 4,214,204 | 7/1980 | Eberle | 324/437 |
| 4,217,645 | 8/1980 | Barry et al. | 324/426 |

*Primary Examiner*—Michael J. Tokar
*Assistant Examiner*—B. J. Kelley
*Attorney, Agent, or Firm*—Benasutti and Murray

[57] ABSTRACT

A method and apparatus for electrically testing individual elements of multi-cell batteries comprises sequentially locating batteries at a test location whereat they are engaged by test probes which are sequentially associated with a testing device which tests the individual cells. If faults are detected, the individual faulty cell is marked. Auxiliary test indicator lights provide a visual indication of the individual testing of each cell as it occurs.

8 Claims, 4 Drawing Figures

METHOD AND APPARATUS FOR ELECTRICALLY TESTING ELEMENTS OF MULTI-CELL BATTERIES

The present invention relates to methods and machines for testing electrical leakage of individual cell elements of multi-cell batteries during assembly.

Conventionally lead-acid storage batteries comprise a container having a plurality of compartments which define the battery cells. In one method of battery manufacturing, lead element assemblies are inserted into each cellular compartment and are thereafter welded together to electrically couple the elements. The batteries are then completed by fusing a cover onto the container and filling the cells with acid.

The lead element assemblies each include an alternating array of positive and negative battery plates. The plates are formed from lead grids which are pasted with lead oxide. Positive and negative battery straps integrally join and electrically couple respective sets of battery plates for each element.

The positive and negative plates must be electrically insulated from each other in order to properly function. Accordingly, insulated separators are disposed between all of the plates of each element to perform this function. It is highly desirous to determine whether the elements of each battery cell are properly insulated before they are welded together.

In the past, each individual element of a battery could be tested prior to welding the cells together, by manually employing an electrical leakage detector such as a Slaughter Hi-Pot Tester. Accordingly, when a faulty cell element was detected, the operator would repair or replace that element thus preventing the assemblage of batteries with faulty cells. Such manual testing, however, was both tedious and labor intensive.

Attempts were made to eliminate most of the manual testing by incorporating an electrical leakage detector within other mechanized assembly line stations upstream from the element welding station. One such machine is the Model M Shear Tester made by the Tiegel Manufacturing Company. That assembly line machine tests the shear strength of the battery straps for each element of six-cell motorcycle batteries and incorporates an electrical leakage detector which simultaneously tests all six cells. In the event one or more cells are faulty, the battery is rejected and displaced from the flow of batteries being assembled. It does not, however, indicate which cell or cells are faulty.

Another assembly line machine which electrically tests the cell elements of a multi-cell batteries is the aligning machine disclosed in U.S. Pat. No. 3,544,754.

It is an object of the present invention to provide an electrical leakage testing machine for testing the individual elements of multi-cell batteries and indicating which elements, if any, are faulty.

Other objects and advantages of the present invention will become apparent from the following portion of the specification and from the accompanying drawings which illustrate, in accordance with the mandate of the patent statutes, a presently preferred embodiment incorporating the principals of the invention.

Referring to the Drawings

Figure 1:
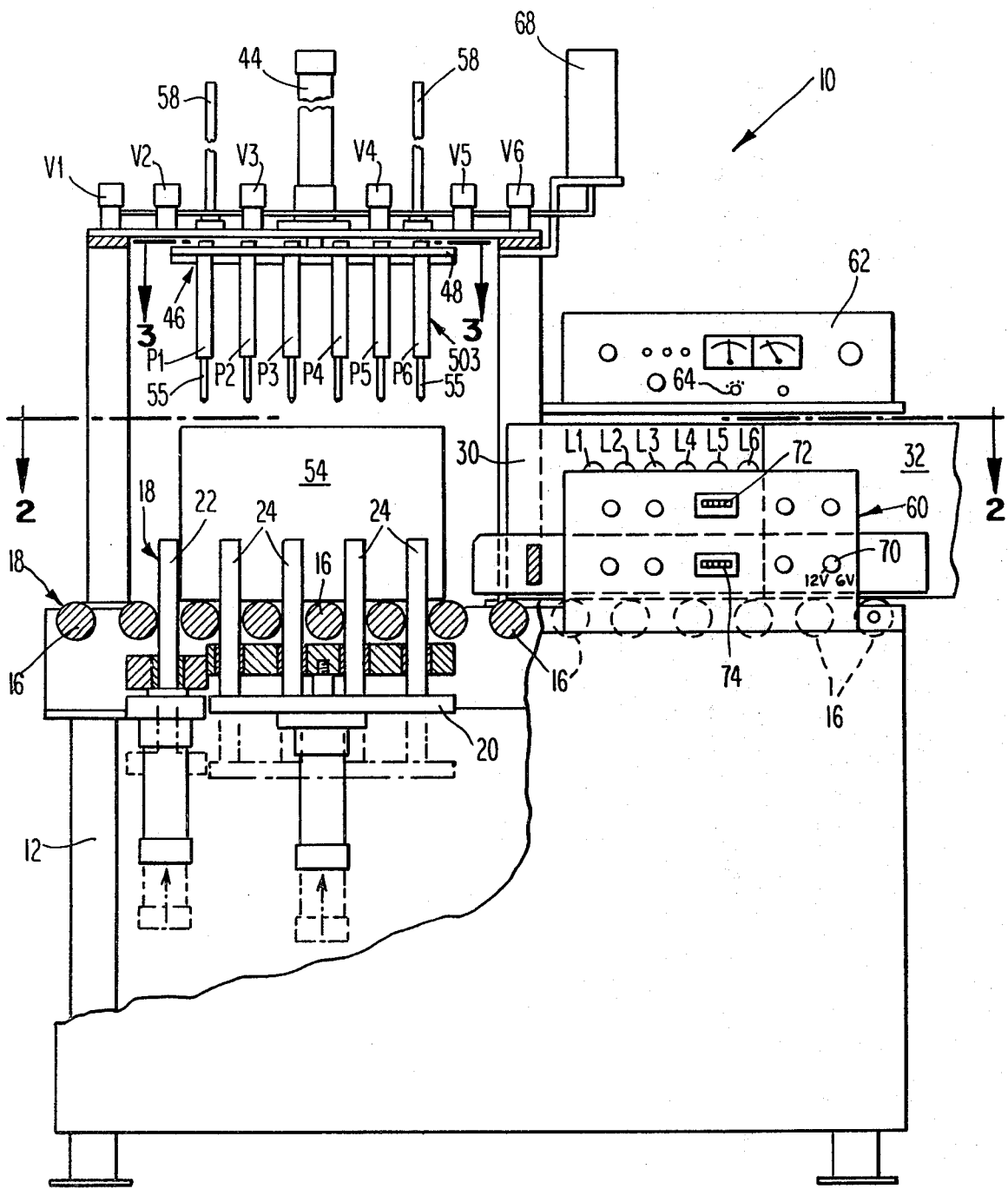
FIG. 1 is an elevated view partially sectioned of a multi-cell battery element testing machine made in accordance with the teachings of the present invention.
Figure 2:
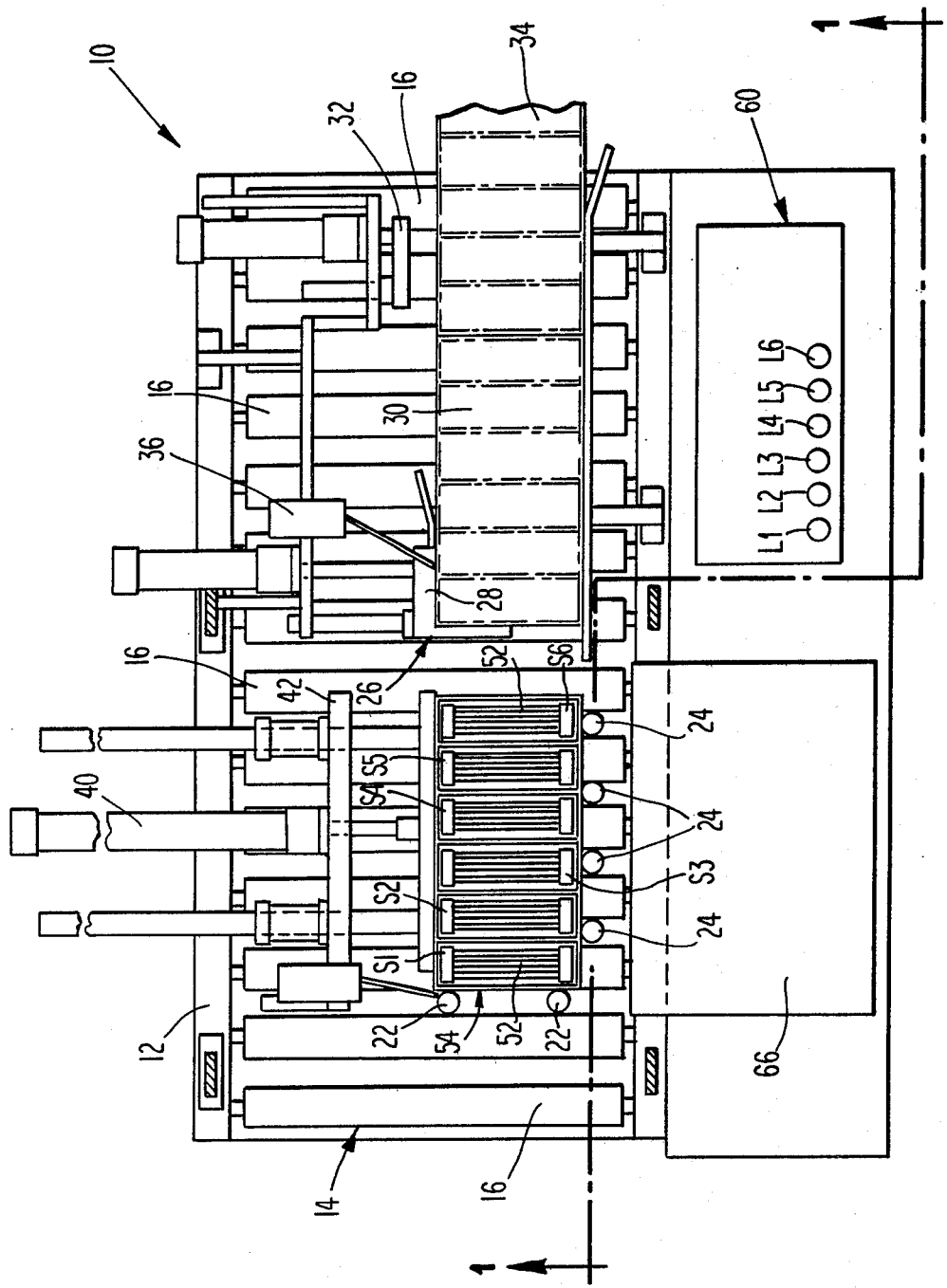
FIG. 2 is a top sectional view of the testing machine shown in FIG. 1.

As can be seen in FIGS. 1 and 2, the testing machine 10 generally includes an upstanding frame 12 which supports a conveyor 14 of powered rollers 16 across its length. The machine 10 is designed to be incorporated into a battery manufacturing assembly line such that it receives batteries to be tested from an input conveyor (not shown) on its right-hand side and passes good batteries from its left-hand side onto an output conveyor (not shown) which transports the batteries to the welding station.

A battery test location is defined by first and second gates 18, 20 having prongs 22, 24, respectively, which project upwardly through the conveyor 14. Since batteries may be continuously supplied to the right-hand end of the conveyor, a feed mechanism 26 is provided to individually feed batteries to the test location. The feed mechanism 26 includes a pneumatically operated stop member 28 which is normally advanced to block the flow of batteries on the conveyor and a normally retracted retard member 32. When a battery 30, engaged with the stop member 28, is to pass to the test location, the retard member 32 is advanced to stop the flow of upstream batteries 34 afterwhich the stop member 28 is retracted allowing the battery 30 to pass. Once the battery passes from the stop member 28, as detected by a limit switch 36, the stop and retard members are returned to their normal positions.

A battery released by the stop member 28 is propelled by the conveyor rollers 16 until it engages the prongs 22 of the first gate 18 afterwhich a first pneumatic cylinder 40 advances a locating bar 42 to force the battery across the conveyor 14 into engagement with the prongs 24 of the second gate 20 thereby positioning the battery in the testing location. Once the battery is positioned, a second pneumatic cylinder 44 lowers a probe assembly 46 which engages the battery for testing.

Figure 3:
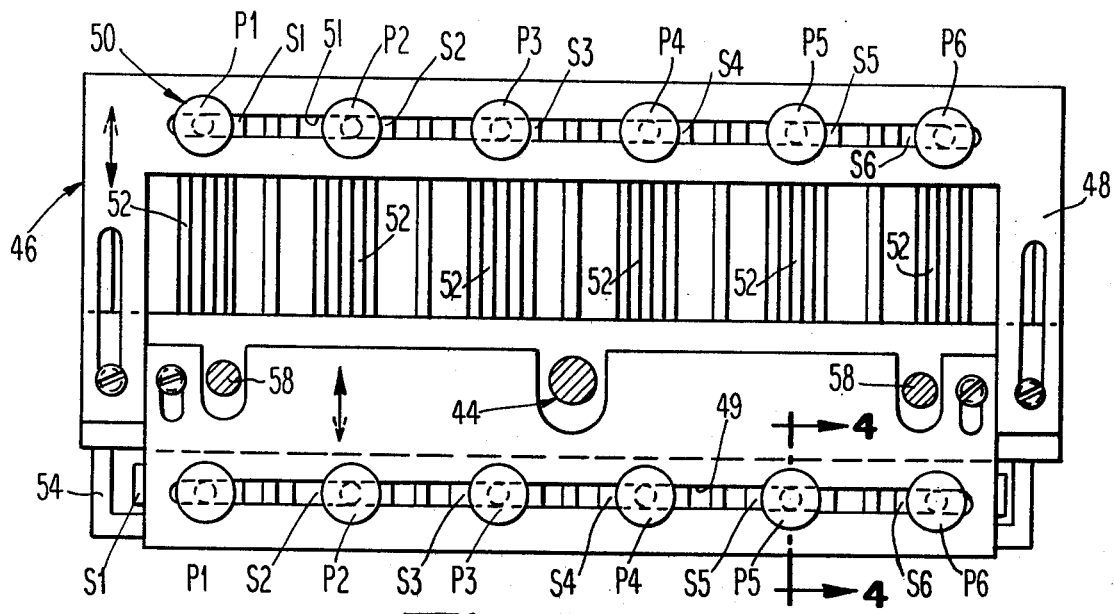
FIG. 3 is a top sectional view showing the electrical probe assembly of the testing machine.
Figure 4:
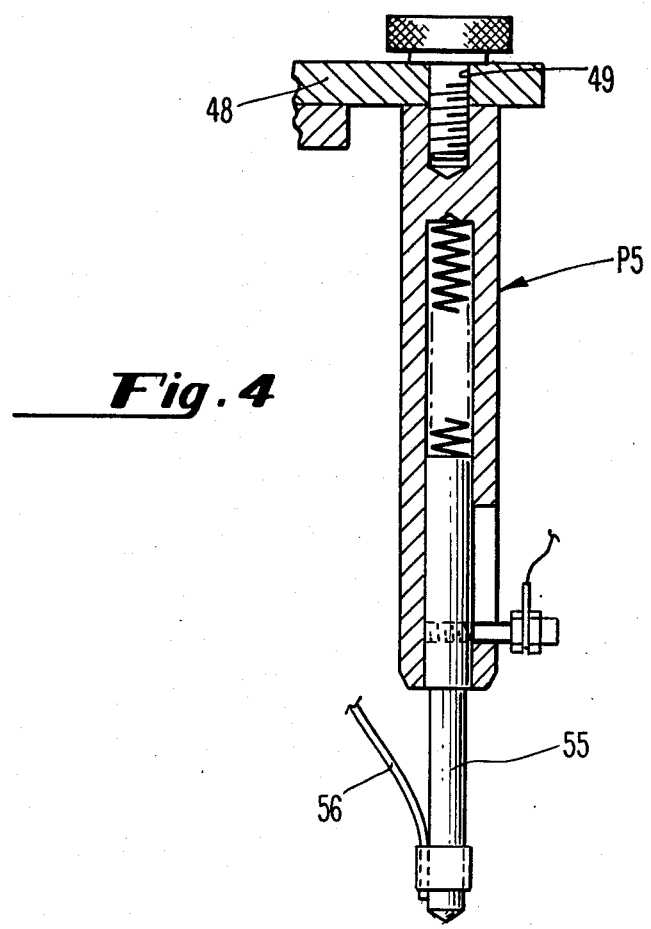
FIG. 4 is a sectional view of an individual electrical probe.

The probe assembly 46 comprises an adjustable frame 48 and a dual array 50 of electrical probes, P1, P2, P3, P4, P5, P6. As can be seen in FIG. 3, the probes are arrayed in front and rear slots 49, 51 of the frame 48, so as to define six probe pairs which are aligned directly above the pair of battery straps S1, S2, S3, S4, S5, S6, of each of the six elements 52 of a battery 54 positioned in the test location. As can be seen in FIG. 4, each probe has a spring loaded conductive tip 55 and a dye marking tube 56 is strapped to the front probe of each probe pair.

As the second pneumatic cylinder 44 lowers the probe assembly 46 rods 58 guide the decent of the probes P1, P2, P3, P4, P5, P6, into the battery 54. After the probe pairs engage the straps S1, S2, S3, S4, S5, S6, of the respective cell elements 52, an electronic control unit 60 causes a conventional testing apparatus 62, such as a Slaughter Hi-Pot Tester, to sequentially energize each probe pair P1, P2, P3, P4, P5, P6, to test electrical leakage of each battery element.

In the preferred embodiment, a test voltage is applied across each probe pair for one second commencing with the left-hand most pair P1 and proceeding sequentially to the next adjacent pair on the right. If a faulty element is detected, a warning light 64 glows and a bell (not shown) sounds during the testing of that element. Since it is known that the test voltage may disintegrate a lead oxide bridge between battery plates which causes an "oxide" short, the control unit 60 causes the retest of an element which triggered a fault before proceeding with the testing of the next element. If the element again tests as faulty, a small quantity of red dye is emitted from the tube 56 secured to the front probe of the respective probe pair to mark the element as faulty.

Upon completion of the testing of all six elements 52, the battery is displaced from the test location. If no element has twice tested as faulty, the first gate 18 is lowered, the battery continues down the assembly line. If one or more elements have failed the double testing, the second gate 20 is lowered and the battery is pushed off the conveyor 14 by the first pneumatic cylinder 44 onto a reject shelf 66 where the faulty elements can be easily identified by the marking dye for quick replacement or repair.

In the preferred embodiment, a single reservoir 68 of marking dye is provided which feeds six solonoid valves V1, V2, V3, V4, V5, V6, which are selectively actuated to permit dye to flow to the respective front probe tubes 56, as described above. Also, a series of six indicator lights L1, L2, L3, L4, L5, L6, are provided to indicate which probe pair P1, P2, P3, P4, P5, P6, respectively, is energized during a particular test. These lights provide a visual backup to the operator to determine which cell is faulty, should be die marking apparatus fail to function.

Since the most prevalent types of batteries to be tested by this machine are twelve volt batteries having six cells and six-volt batteries having three cells, a single switch 70 is provided to deactivate three of the probe pairs. Accordingly, when six-volt, three-cell batteries are to be tested, the left-hand three probe pairs P1, P2, P3, are adjusted for alignment with the element straps of those batteries and the switch 70 is turned to its six-volt setting deactivating the right-hand three probe pairs P4, P5, P6. Additionally counter 72, 74 are provided to meter the number of batteries tested and rejected respectively.

What is claimed:

1. An apparatus for electrically testing individual elements of multi-cell batteries comprising:
   means for individually locating multi-cell batteries at a selected test location, and
   means for testing each element of each multi-cell battery when located at said test location for electrical leakage including
   an array of probe means, at least one for each battery cell,
   fault detector means having fault indicator means responsive to a detected fault,
   means for advancing said array of probe means to a testing position such that each element of a battery positioned in said test location is engaged by one of said probe means,
   means for sequentially associating individual ones of said probe means with said fault detector means thereby sequentially electrically testing the elements of the battery, and
   means for marking the battery to indentify individual faulty elements responsive to selected faults detected by said fault detector means.

2. The apparatus of claim 1 further comprising test indicator means associated with each probe means for indicating when each probe means is associated with said fault detector means during testing of the battery elements.

3. The battery element testing apparatus of claim 1, wherein said sequential associating means causes each element which has tested as faulty to be retested by again associating the respective probe means with said fault detector means, and
   said marking means marks each battery element which has twice tested as faulty.

4. A method for electrically testing individual elements of multi-cell batteries comprising:
   individually locating multi-cell batteries at a selected test location, and
   testing each element of each multi-cell battery when located at said test location for electrical leakage employing an array of probe means, at least one for each battery cell, and fault detector means having fault indicator means responsive to a detected fault, including
   advancing said array of probe means to a testing position such that each element of a battery positioned in said test location is engaged by one of said probe means,
   sequentially associating individual ones of said probe means with said fault detector means thereby sequentially electrically testing the elements of the battery, and
   marking the battery to indentify individual faulty elements responsive to selected faults detected by said fault detector means.

5. The method for electrically testing individual elements of multi-cell batteries according to claim 4 further comprising:
   visually indicating the testing of each individual element as it occurs.

6. A method for electrically testing individual elements of multi-cell batteries according to claim 4 further comprising:
   sequentially associating each probe means engaged with a battery element which has once tested as faulty with said fault detector means thereby retesting the elements of the battery which have initially tested as faulty; and
   marking the battery to identify individual faulty elements which have twice tested as faulty.

7. An apparatus for electrically testing individual elements of multi-cell batteries comprising:
   means for individually locating multi-cell batteries at a selected test location; and
   means for testing each element of each multi-cell battery when located at said test location for electrical leakage including:
   an array of probe means, at least one for each battery cell;
   fault detector means;
   means for advancing said array of probe means to a testing position such that each element of a battery positioned in said test location is engaged by one of said probe means;
   means for sequentially associating individual ones of said probe means with said fault detector means thereby sequentially electrically testing the elements of the battery; and
   fault indicator means for indentifying individual faulty elements responsive to faults detected by said fault detector means.

8. An apparatus according to claim 7 further comprising:
   means for marking the tested battery to further identify individual faulty elements responsive to selected faults detected by said fault detector means.

* * * * *